US006831457B2

(12) United States Patent
Honkura et al.

(10) Patent No.: US 6,831,457 B2
(45) Date of Patent: Dec. 14, 2004

(54) TWO-DIMENSIONAL MAGNETIC SENSOR INCLUDING MAGNETO-IMPEDANCE SENSOR ELEMENTS

(75) Inventors: Yoshinobu Honkura, Tokai (JP); Masaki Mori, Tokai (JP); Michiharu Yamamoto, Tokai (JP); Yoshiaki Koutani, Tokai (JP)

(73) Assignee: Aichi Micro Intelligent Corporation, Tokai (JP)

( * ) Notice: Subject to any disclaimer, the term of this patent is extended or adjusted under 35 U.S.C. 154(b) by 80 days.

(21) Appl. No.: 10/274,128

(22) Filed: Oct. 21, 2002

(65) Prior Publication Data

US 2003/0155913 A1 Aug. 21, 2003

(30) Foreign Application Priority Data

Feb. 19, 2002 (JP) ........................................ 2002-042382

(51) Int. Cl.[7] ................................................. G01R 33/02
(52) U.S. Cl. ........................ 324/249; 324/253; 324/247; 33/361
(58) Field of Search ................................. 324/253, 235, 324/244, 247, 249, 252, 260; 33/361, 355 R

(56) References Cited

U.S. PATENT DOCUMENTS

| | | | | |
|---|---|---|---|---|
| 4,939,459 A | * | 7/1990 | Akachi et al. | ............... 324/247 |
| 5,924,212 A | * | 7/1999 | Domanski | ................... 33/55 R |
| 6,210,008 B1 | * | 4/2001 | Hoekstra et al. | ............ 359/603 |
| 6,232,775 B1 | * | 5/2001 | Naitoh et al. | ................ 324/249 |
| 6,380,735 B1 | * | 4/2002 | Kawakami | .................... 324/253 |
| 2001/0030537 A1 | * | 10/2001 | Honkura et al. | ............ 324/249 |

FOREIGN PATENT DOCUMENTS

| | | |
|---|---|---|
| JP | 1-163686 | 6/1989 |
| JP | 5-157566 | 6/1993 |
| JP | 6-129855 | 5/1994 |
| JP | 8-178662 | 7/1996 |
| JP | 11-63997 | 3/1999 |
| JP | 11-64473 | 3/1999 |

OTHER PUBLICATIONS

O. Shimoe, et al., Technical Report, vol. 18, pp. 37–42, "Magnetic Compass Using Magneto–Resistive Device", 2002 (with English Abstract).
N. Pollock, Wireless World, pp. 49–54, "Electronic Compass Using a Fluxgate Sensor", Oct. 1982.

* cited by examiner

*Primary Examiner*—Jay Patidar
(74) *Attorney, Agent, or Firm*—Oblon, Spivak, McClelland, Maier & Neustadt, P.C.

(57) ABSTRACT

The present invention is a two-dimensional magnetic sensor having a first magneto-impedance sensor element including a first magneto-sensitive element and a first electro-magnetic coil which is wound around said first magneto-sensitive element; a second magneto-impedance sensor element including a second magneto-sensitive element and a second electro-magnetic coil which is wound around said second magneto-sensitive element; and an integrated circuit including an oscillator, a current switching element, a voltage detector, and an amplifier.

15 Claims, 3 Drawing Sheets

TWO-DIMENSIONAL MAGNETIC SENSOR INCLUDING MAGNETO-IMPEDANCE SENSOR ELEMENTS

FIELD OF THE INVENTION

The present invention relates to high-sensitivity two-dimensional magnetic sensors that detect terrestrial magnetic fields and the like.

PRIOR ART

Concerning magnetic field detection devices which detect terrestrial magnetic fields, and invention which uses the highly sensitive MI element is disclosed in Japanese Patent Application Laid-open (Kokai) 2001-296127. The invention described therein places MI elements in two axes, uses a negative feedback circuit, etc., and performs heat compensation with a differential circuit.

SUMMARY OF THE INVENTION

An electronic compass with a miniature size and efficient power use suitable for portability is needed for mobile devices, including mobile phones. Such an electronic compass would need a two-dimensional, highly sensitive magnetic sensor.

Such a magnetic sensor would require a range in which output voltage is linear in response to the strength of the magnetic field (hereafter called the magnetic field measurability range) of ±2.7 G or more. When used in a device like a mobile phone, this two-dimensional magnetic sensor will inevitably be used in a variety of locations, some of which will have magnetic field strengths much greater than ±2.7 G.

The magnetic field detection device of Japanese Patent Application Laid-open (Kokai) 2001-296127, when not equipped with a negative feedback circuit, had a linear magnetic filed measurability range of ±40 A/m (that is, 0.5 G), and thus was not suitable as such for use as an electronic compass. To resolve that problem, the invention was equipped with a coil which provided negative feedback and used a circuit that was constantly passing current.

The above technology used two MI elements for each axis as well as a differential circuit to perform a differential operation on these two signals, and because it used a negative feedback circuit, the scale of the electric circuit increased and became unsuitable for miniaturization. Power consumption also increased due to the flow of negative feedback current which was used to enlarge the magnetic field measurability range. Finally, the size of the prior MI element was large—3 mm wide, 2 mm tall, and 4 mm long—making its application in miniature electronic devices difficult.

Thus, to resolve the above problems, it was necessary to develop a two-dimensional magnetic sensor that was smaller, used less power, and had a wider magnetic field measurability range.

Thereupon, the present inventors, having researched the miniaturization of the MI element, came upon the following construction.

A two-dimensional magnetic sensor which detects external magnetic fields comprises a first magneto-impedance sensor element, called the first MI element, provided to detect the first axial component of said external magnetic field, and which comprises a first magneto-sensitive element less than 2 mm long and a first electromagnetic coil which is wound around the said first magneto-sensitive element; a second magneto-impedance sensor element, called the second MI element, provided to detect the second axial component of said external magnetic field and which comprises a second magneto-sensitive element less than 2 mm long and a second electromagnetic coil which is wound around the said second magneto-sensitive element; and an integrated circuit comprising an oscillating means which supplies a pulse or high-frequency current, a means for switching current alternatingly between said first MI element and said second MI element, a means for detecting the output voltage from the electromagnetic coils of said first and second MI elements, and an amplifier which amplifies the output voltage of said detection means.

A feature of one embodiment of the present invention is that, by shortening the length of the first and second magneto-sensitive elements to 2 mm or less, which is shorter than those of the past, the range in which output voltage is linear with respect to the strength of the magnetic field (that is, the magnetic field measurability range) now reaches ±10 G without the use of a negative feedback circuit. Hereby an expansion of the magnetic field measurability range not previously possible, the miniaturization of the MI element and the omission of a negative feedback circuit, and a substantial reduction of power consumption via the omission of a negative feedback circuit are all realized.

In addition, the use of a switching means to switch current back and forth between the elements allows for a further reduction in power consumption.

In addition, in each of the above MI elements, the inside diameter is less than 200 $\mu$m by virtue of the fact that there is no circuit board fixing the magneto-sensitive element between the magneto-sensitive element and the electromagnetic coil and only an insulator surrounds the magneto-sensitive element, and the first electromagnetic coil has a coil spacing per unit length of less than 100 $\mu$m/turn.

In the above construction, because the electro-magnetic coil is held using only an insulator around the magneto-sensitive element, the inside diameter can be reduced to less than 200 $\mu$m, and a further overall miniaturization of the MI element may be achieved while improving the output voltage.

Finally, the output voltage increases because of the turns per unit length increase due to the reduction of coil spacing per unit length in the electromagnetic coil. In practice, it is favorable to have 100 $\mu$m/turn or less. If the present output voltage is ample, the MI element may be shortened.

EXPLANATION OF THE MARKS

1 Electrode substrate, 2 Amorphous wire, 3 Electromagnetic coil, 4 Insulating resin, 5 Electrode, 6 Axis output switching circuit, 7 Signal generator, 8 Simultaneous detection circuit, 9 Amplifier, 10 MI element, 111 Groove face, 112 Upper groove face, 31 One side of the electro-magnetic coil, 32 The other side of the electromagnetic coil, 70 Integrated circuit, 100 Two-dimensional magnetic sensor.

DESCRIPTION OF THE PREFERRED EMBODIMENT

Figure 1:
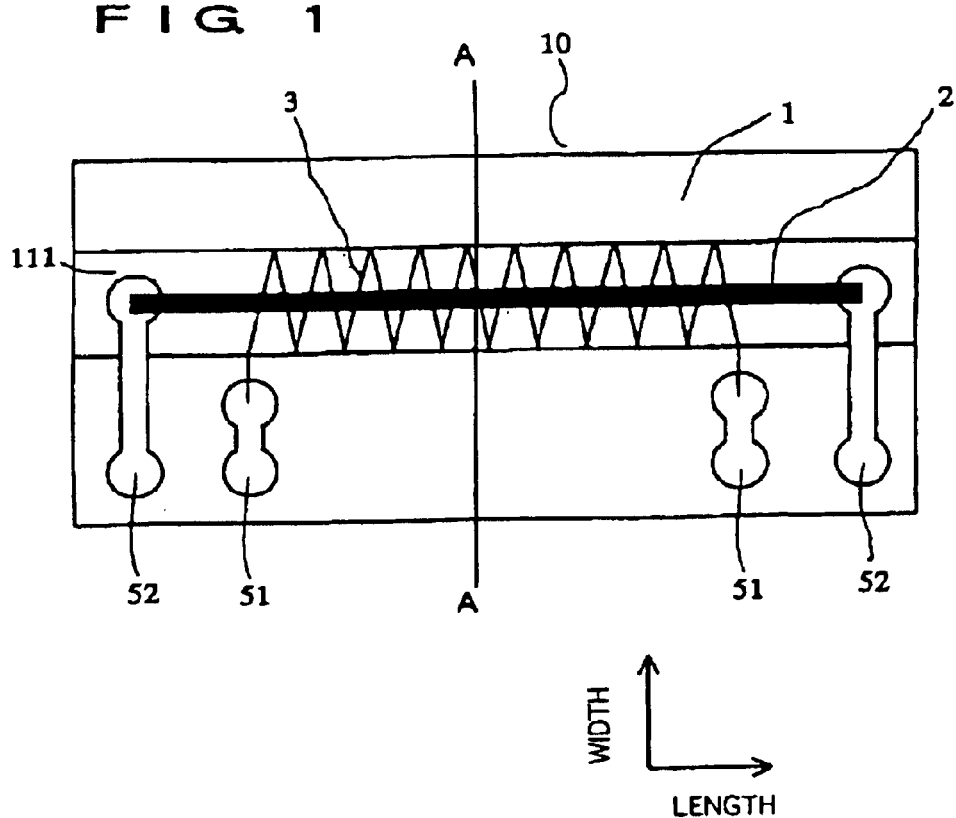
FIG. 1 shows a front view of the MI element of the preferred embodiment of the present invention.
Figure 2:
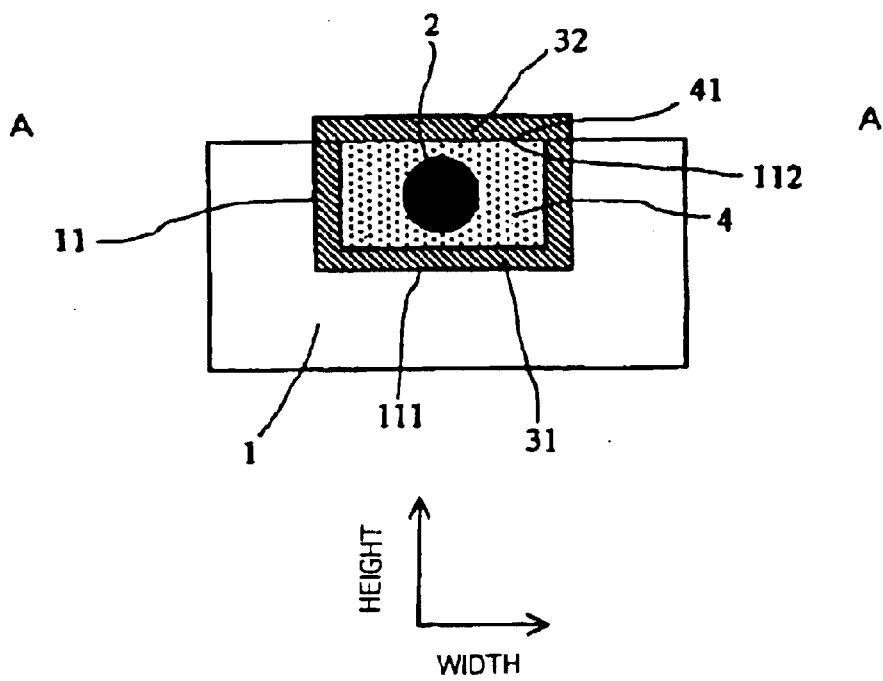
FIG. 2 shows a cross-sectional view of the MI element of the preferred embodiment of the present invention.

The preferred embodiment of the MI element of the present invention is explained using FIGS. 1 and 2.

A two-dimensional magnetic sensor according to the preferred embodiment which detects external magnetic field comprises; a first and second magneto-impedance sensor elements, called a first and second MI element, mounted respectively on a device mount board to detect first and second axial components of the external magnetic field, comprise first and second magneto-sensitive element and first and second electromagnetic coils which are wound around said first and second magneto-sensitive element, and an integrated circuit, mounted on said device mounted board, comprising an oscillating means which supplies a pulse or high-frequency current, a means for switching current alternatingly between said first MI element and said second MI element, a means for detecting the output voltage from the electromagnetic coils of said first and second MI elements, and an amplifier which amplifies the output voltage of said detection means.

Substrate 1 as the device mount board measures 0.5 mm wide, 0.5 mm tall, and 2 mm long. The magneto-sensitive element is amorphous wire 2, made of a CoFeSiB alloy with a 30$\mu$m diameter. Electro-magnetic coil 3 is formed by a two-layer structure made of coil side 31 which is placed on the bottom face 111 of groove 11, and other side coil 32 placed in groove upper face 112 (upper face 41 of resin 4), and has an average equivalent inside diameter (the area formed by the height and width and the circular diameter which determines that area) of 66 $\mu$m. The coil spacing per unit length of electro-magnetic coil 3 is 50 $\mu$m per turn.

Resin 4, which possesses insulating properties, is placed between amorphous wire 2 and electromagnetic coil 3, and insulates the conductive magnetic amorphous wire from the electro-magnetic coil. Electrode 5 has four total parts, electromagnetic coil terminals 51 and terminals 52 of the magneto-sensitive element, printed on the upper face of the substrate. The two ends of electromagnetic coil 3 and the two ends of amorphous wire 2 are connected at electrode 5. What is comprised as above is the electromagnetic coil equipped MI element 10 of the present invention. Incidentally, the size of the present element is the same as the size of the electrode circuit board.

Figure 3:
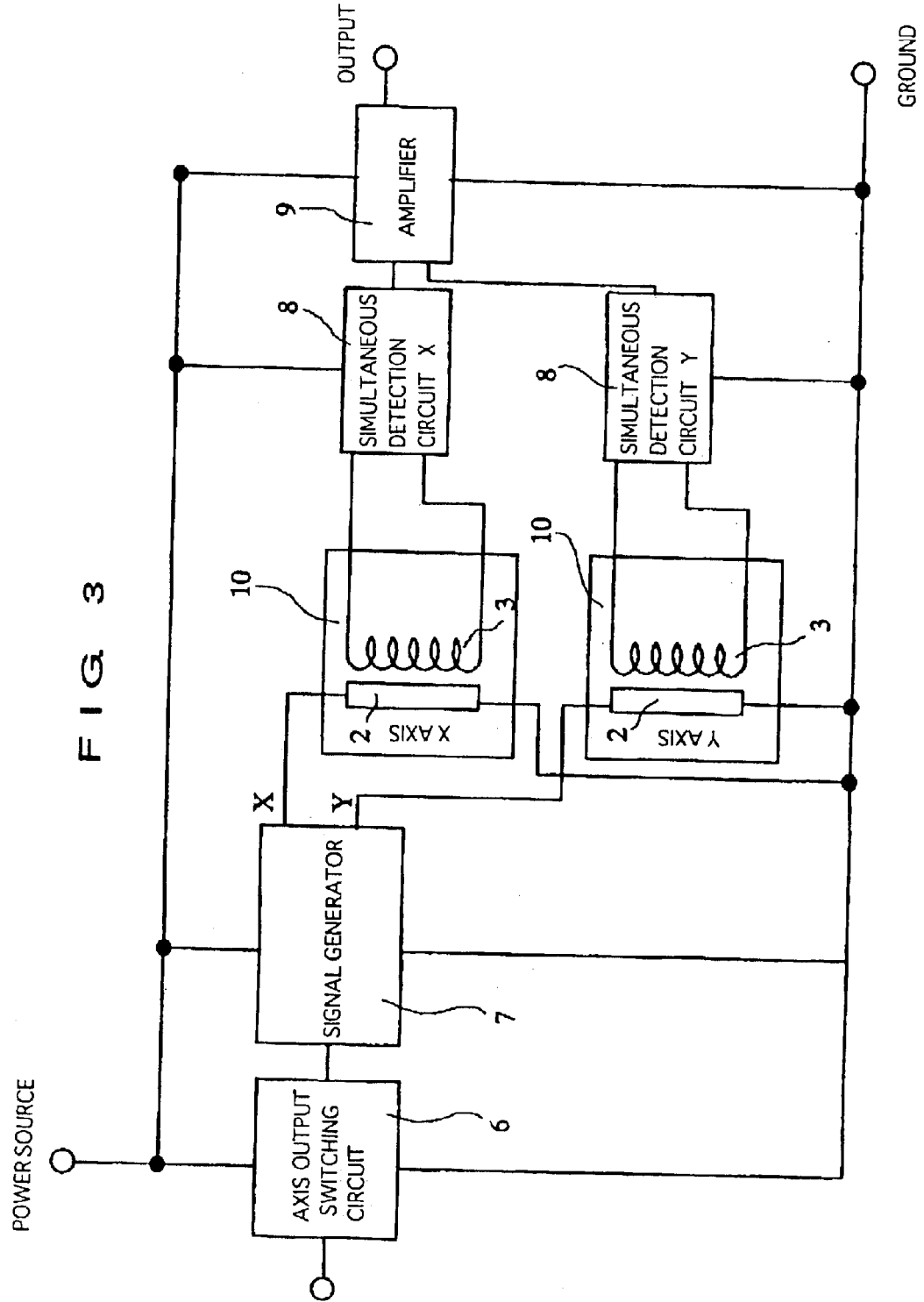
FIG. 3 shows a circuit diagram of a two-dimensional magnetic sensor which uses the MI element of the preferred embodiment of the present invention.

Next, we examine the circuit diagram of a two-dimensional magnetic sensor which uses said MI element 10 in FIG. 3.

The oscillating means, signal generator 7, has two output terminals X and Y which are connected to the MI elements of the X and Y axes, respectively. Signal generator 6 uses the control signal of the axis output switching circuit to switch the pulse alternatingly between the MI elements of the X and Y axes. Hereby the use of the two MI elements is halved, resulting in power economization.

Signal generator 6 generates a 200 MHz, 170 mA pulse signal with a period of 1 $\mu$ sec. The pulse signal is sent to amorphous wires 2 of the MI elements, at which point a voltage proportional to the external magnetic field (terrestrial magnetism) is generated in electro-magnetic coil 3.

The detecting means, simultaneous detection circuit 8, detects said voltage which is generated in electromagnetic coil 3 simultaneously with the MI element current.

Amplifier 9 amplifies the voltage to the desired level and outputs it. All the operations after the signal generator are repeated alternating in the MI elements of the X and Y axes.

Figure 4:
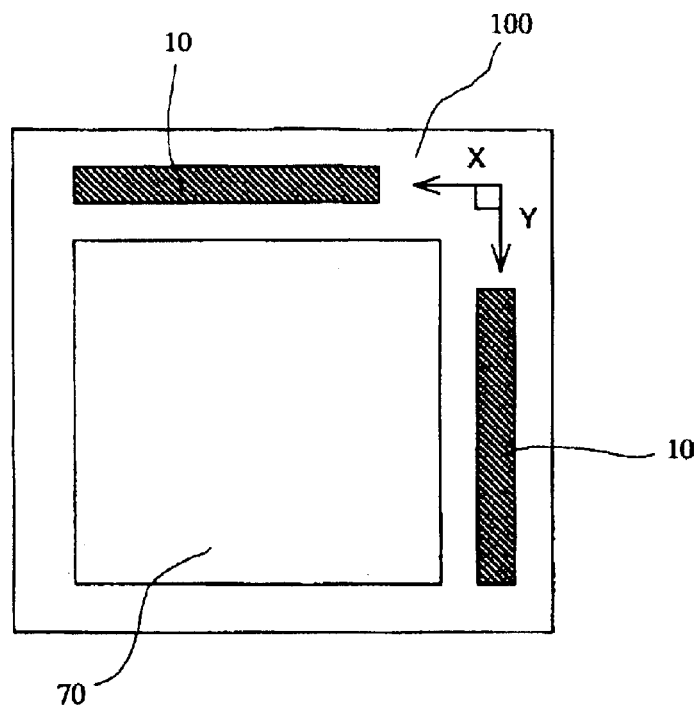
FIG. 4 shows a parts layout with the circuit of FIG. 3 made into an integrated circuit and mounted on the same substrate as the MI element.

In FIG. 4, the circuit of FIG. 3 is shown as an integrated circuit mounted on the same substrate as the MI element. In this figure, X and Y MI elements 10 are placed orthogonally to one another. The circuit of FIG. 3 is now integrated circuit 70. The size of this two-dimensional magnetic sensor 100, though not shown in the figure, is extremely small at 5 mm by 5 mm when equipped with electrodes. Direction is obtained from the output voltages of the X and Y axes using a publicly known method.

Figure 5:
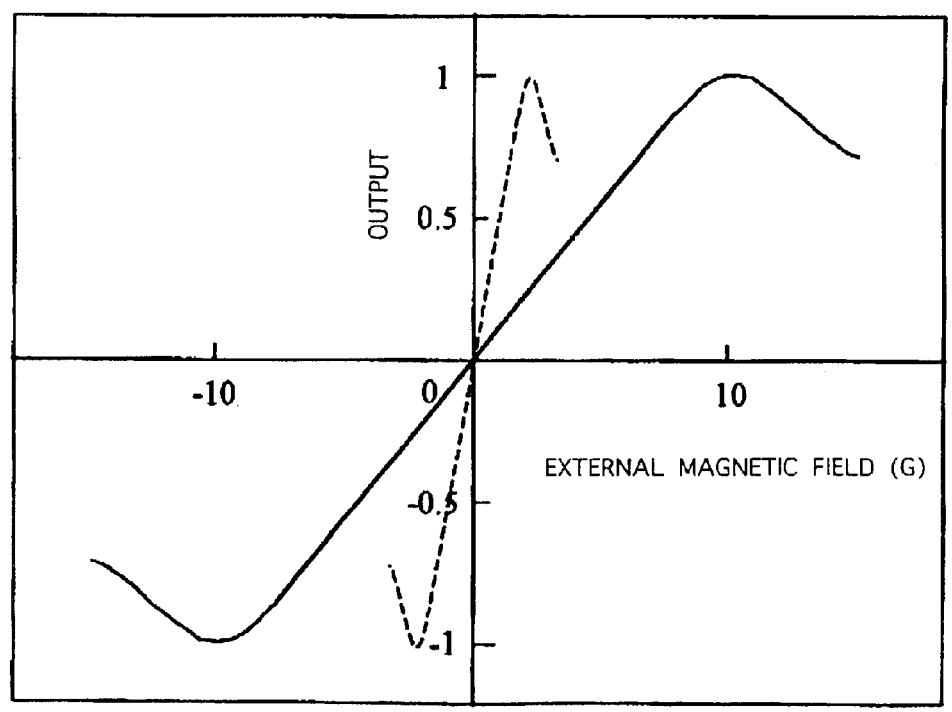
FIG. 5 shows a sensor output versus external magnetic field for a two-dimensional magnetic sensor using the MI element of the preferred embodiment of the present invention and for a sensor which uses the circuitry (with no negative feedback circuit) and MI element of Japanese Patent Application Laid-open (Kokai) 2001-296127.

The sensor output from said circuit is shown in FIG. 5.

The strength of the external magnetic field is shown horizontally and sensor output is shown vertically. The solid line shows the output from the present preferred embodiment, and shows near perfect linearity between −10 G and +10 G. The preferred embodiment, then, achieves the magnetic field measurability range necessary for an electronic compass, ±2.7 G, with plenty of room to spare. For comparison, the dotted line shows the sensor output when the circuitry (with no negative feedback circuit) and MI element of Japanese Patent Laid-open (Kokai) 2001-296127 are used. The prior example's output peak was at one. These results have allows for the expansion of the magnetic field measurability range to ±10 G without using a negative feedback circuit. The present preferred embodiment allows for a wider magnetic field measurability not previously possible, a miniaturization of the MI element as well as an overall miniaturization due to the omission of the negative feedback coil, negative feedback circuit, and differential circuit, and, with the omission of the negative feedback current and the use of a switching means, a substantial reduction in power consumption.

What is claimed is:

1. A two-dimensional magnetic sensor which detects an external magnetic field comprising:
    a first magneto-impedance sensor element, called a first MI element, provided to detect a first axial component of said external magnetic field, and which includes a first magneto-sensitive element less than 2 mm long and a first electro-magnetic coil which is wound around said first magneto-sensitive element;
    a second magneto-impedance sensor element, called a second MI element, provided to detect a second axial component of said external magnetic field and which includes a second magneto-sensitive element less than 2 mm long and a second electro-magnetic coil which is wound around said second magneto-sensitive element; and
    an integrated circuit including an oscillator configured to supply a pulse or high-frequency current, a current switching element configured to switch current alternatingly between said first MI element and said second MI element, a voltage detector configured to detect an output voltage from the electro-magnetic coils of said first and second MI elements, and an amplifier which amplifies the output voltage of said voltage detector.

2. A two-dimensional magnetic sensor as defined in claim 1, wherein, in said first and second MI elements, there is no substrate directly fixing the magneto-sensitive element in the space between the magneto-sensitive element and the electro-magnetic coil and only insulation is used around the magneto-sensitive element so that the inside diameter is less than 200 μm, and said first electro-magnetic coil has a coil spacing per unit length of less than 100 μm/turn.

3. A two-dimensional magnetic sensor as defined in claim 1, wherein said first and second electro-magnetic coils have a structure comprising a first side placed on a bottom face of a short groove in a substrate, and a second side placed in an upper face of said groove.

4. A two-dimensional magnetic sensor as defined in claim 3, further comprising:

an insulator which fills the space between the first and second sides of said electro-magnetic coil and in which said first and second magneto-sensitive elements are held.

5. A two-dimensional magnetic sensor as defined in claim 4, in which said first and second magneto-sensitive elements held in said insulator are made of amorphous wire.

6. A two-dimensional magnetic sensor as defined in claim 5, wherein said insulator is resin.

7. A two-dimensional magnetic sensor as defined in claim 6, wherein said amorphous wire is made of a CoFeSiB alloy.

8. A two-dimensional magnetic sensor as defined in claim 7, further comprising:

a first electode on an upper face of the substrate, said first electrode including an electro-magnetic coil terminal connected to each end of said first electro-magnetic coil, and a first magneto-sensitive element terminal connected to each end of said amorphous wire which comprises said first magneto-sensitive element.

9. A two-dimensional magnetic sensor as defined in claim 8, wherein said first MI element is mounted in an X direction of a device mount board and said second MI element is mounted in a Y direction of said device mount board, orthogonal to said X direction, while said integrated circuit is integrally mounted on another part of the device mount board.

10. A two-dimensional magnetic sensor as defined in claim 9, wherein said device mount board is 5 mm by 5 mm.

11. A two-dimensional magnetic sensor as defined in claim 3, wherein said substrate is 0.5 mm wide, 0.5 mm high, and 2 mm long, and said groove formed in said substrate is 50 μm deep, 70 μm wide, and 2 mm long.

12. A two-dimensional magnetic sensor as defined in claim 3, wherein said first and second electro-magnetic coils have an average equivalent inside diameter of 66 μm, and a coil spacing per unit length of 50 μm/turn.

13. A two-dimensional magnetic-sensor which detects an external magnetic field comprising:

a first magneto-impedance sensor element, called a first MI element, mounted on a device mount board to detect a first axial component of the external magnetic field, said first MI element including a first magneto-sensitive element and a first electro-magnetic coil which is wound around said first magneto-sensitive element;

a second magneto-impedance sensor element, called a second MI element, mounted on said device mount board to detect a second axial component of the external magnetic field, said second MI element including a second magneto-sensitive element and a second electro-magnetic coil which is wound around said second magneto-sensitive element, said first and second electro-magnetic coils having a structure including a first side placed on a bottom face of a short groove in a substrate and a second side placed in an upper face of said groove, said first and second magneto-sensitive elements, which are placed in an insulator which fills a space between said first and second sides of the electro-magnetic coil, are amorphous wires, and said two-dimensional magnetic sensor includes a means for detecting which passes current to the first and second MI elements and detects an output voltage of the electro-magnetic coils of said first and second MI elements.

14. A two-dimensional magnetic sensor as defined in claim 13, wherein said detecting means comprises a means for passing current alternatingly between the first and second MI elements.

15. A two-dimensional magnetic sensor as defined in claim 14, wherein said detecting means comprises an integrated circuit and is mounted on said device mount board.

* * * * *